(12) United States Patent
Stojetz et al.

(10) Patent No.: US 10,714,901 B2
(45) Date of Patent: Jul. 14, 2020

(54) EDGE-EMITTING SEMICONDUCTOR LASER

(71) Applicant: OSRAM OLED GMBH, Regensburg (DE)

(72) Inventors: Bernhard Stojetz, Wiesent (DE); Georg Brüderl, Burglengenfeld (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/092,495

(22) PCT Filed: Mar. 27, 2017

(86) PCT No.: PCT/EP2017/057208
§ 371 (c)(1),
(2) Date: Oct. 10, 2018

(87) PCT Pub. No.: WO2017/178219
PCT Pub. Date: Oct. 19, 2017

(65) Prior Publication Data
US 2019/0173264 A1    Jun. 6, 2019

(30) Foreign Application Priority Data

Apr. 14, 2016 (DE) .................. 10 2016 106 949

(51) Int. Cl.
*H01S 5/32* (2006.01)
*H01S 5/042* (2006.01)
(Continued)

(52) U.S. Cl.
CPC .......... *H01S 5/3201* (2013.01); *H01S 5/0425* (2013.01); *H01S 5/04254* (2019.08); *H01S 5/22* (2013.01); *H01S 5/32341* (2013.01)

(58) Field of Classification Search
CPC .. H01S 5/0425; H01S 5/04254; H01S 5/3201; H01S 5/32341
See application file for complete search history.

(56) References Cited

U.S. PATENT DOCUMENTS 6,381,258 B1    4/2002   Takei et al.
8,976,829 B2    3/2015   Koenig et al.
(Continued)

FOREIGN PATENT DOCUMENTS

CN    101675539 A    3/2010
CN    102893466 A    1/2013
(Continued)

OTHER PUBLICATIONS

Masters, C.B. et al., "Geometrically Nonlinear Stress-Deflection Relations for Thin Film/Substrate Systems," International Journal of Engineering Science, vol. 31, Issue 6, Jun. 1993, 11 pages.
(Continued)

*Primary Examiner* — Michael Carter
(74) *Attorney, Agent, or Firm* — Slater Matsil, LLP

(57) ABSTRACT

In an embodiment a laser include a semiconductor layer sequence having an active zone for generating radiation and an electrical contact web arranged on a top side of the semiconductor layer sequence, wherein the contact web is located on the top side only in an electrical contact region or is in electrical contact with the top side only in the contact region so that the active zone is supplied with current only in places during operation, wherein the contact web comprises a plurality of metal layers at least partially stacked one above the other, wherein at least one of the metal layers comprises a structuring so that the at least one metal layer only partially covers the contact region and has at least one opening or interruption, and wherein the structuring reduces stresses of the semiconductor layer sequence on account of different thermal expansion coefficients of the metal layers.

20 Claims, 6 Drawing Sheets

(51) Int. Cl.
    *H01S 5/22*        (2006.01)
    *H01S 5/323*       (2006.01)

(56)         References Cited

U.S. PATENT DOCUMENTS 9,054,487 B2 *   6/2015   Avramescu ......... H01S 5/02461
       9,281,656 B2     3/2016   Mueller et al.
    2003/0165169 A1     9/2003   Nomoto et al.
    2010/0208763 A1     8/2010   Engl et al.
    2010/0284434 A1 *  11/2010   Koenig ................ H01S 5/0425
                                                              372/46.01

FOREIGN PATENT DOCUMENTS

DE      102008014092 A1    7/2009
    DE      102012106687 A1    2/2014
    DE      102012111512 A1    5/2014
    JP         2004104076 A    4/2004

OTHER PUBLICATIONS

Moram, M. A. et al., "X-Ray Diffraction of III-Nitrides," Reports on Progress in Physics, vol. 72, No. 3, 036502, 2009, 40 pages.
"Young's Modulus," Wikipedia Article, downloaded from https://en.wikipedia.org/wiki/Young's_modulus on Jul. 17, 2018, 9 pages.

* cited by examiner

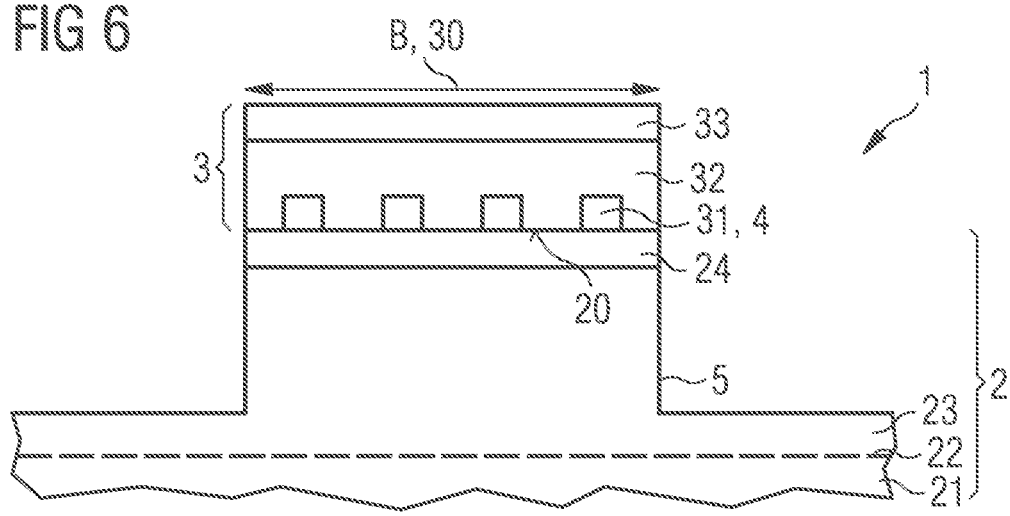
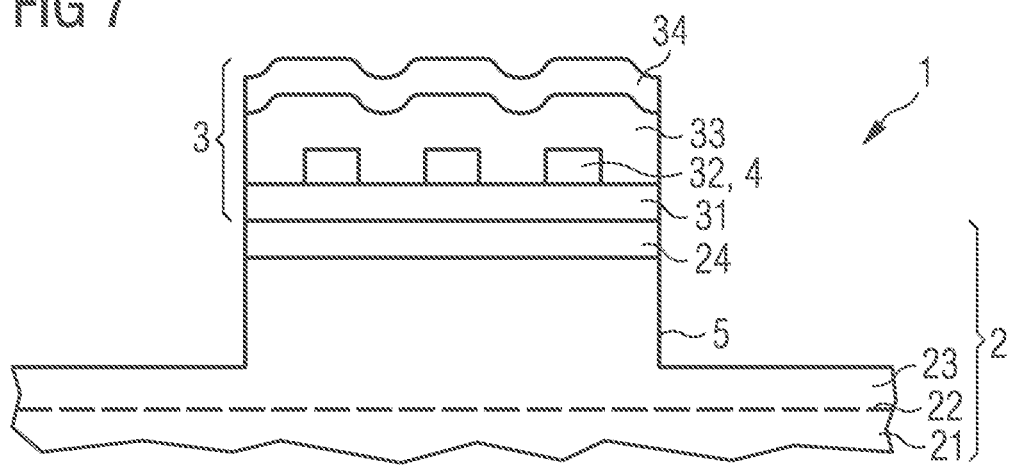
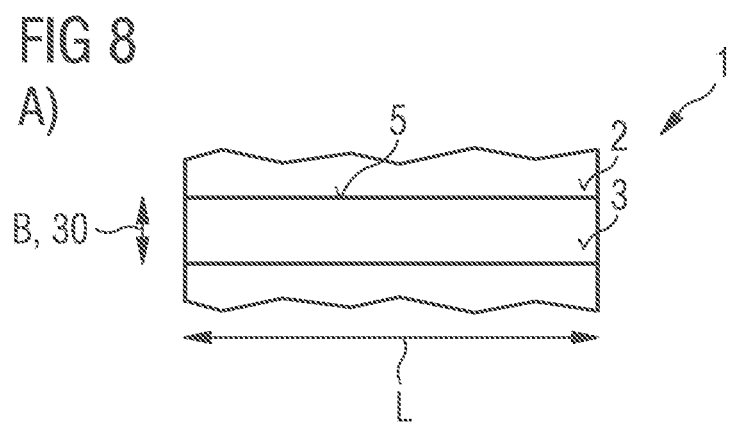

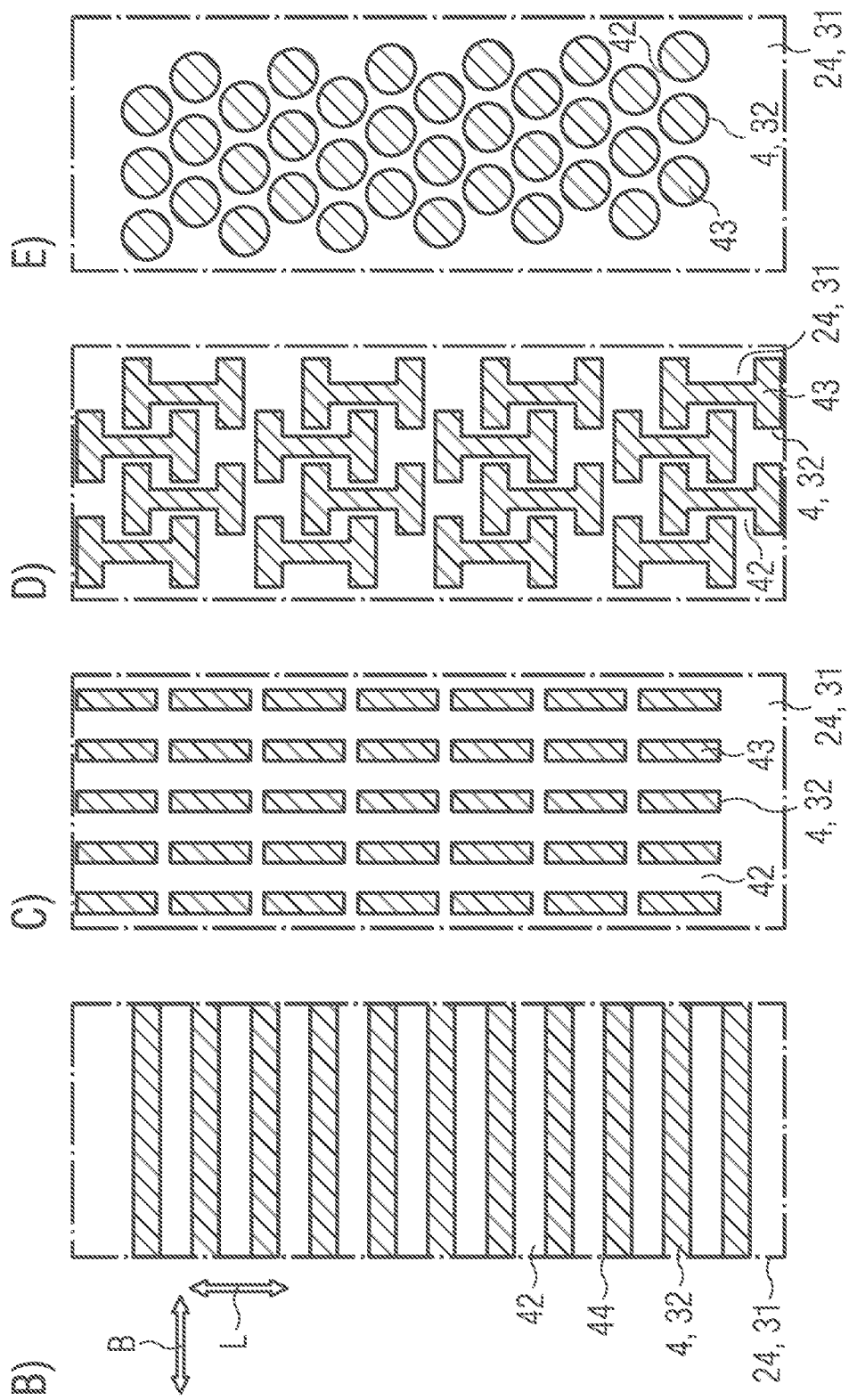

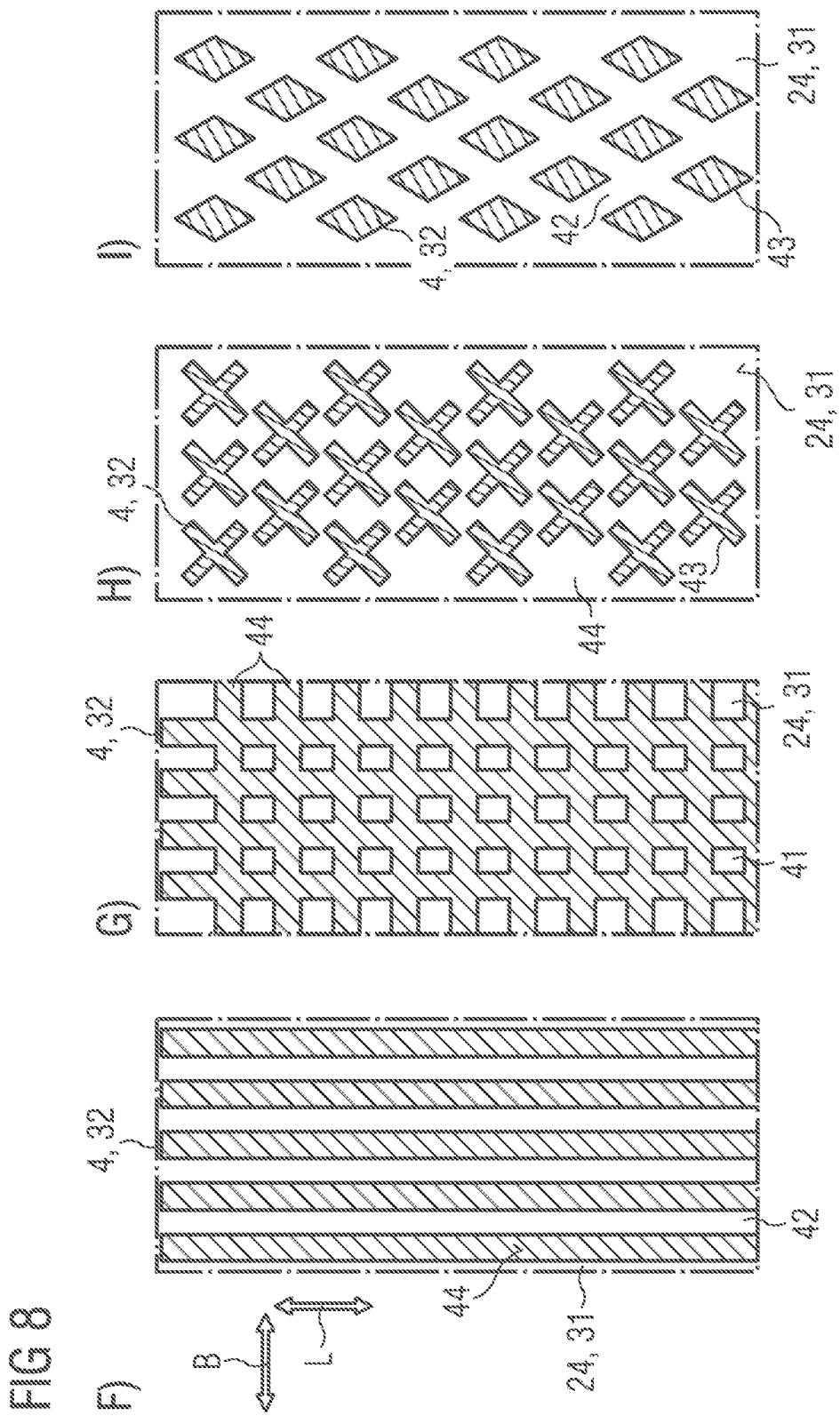

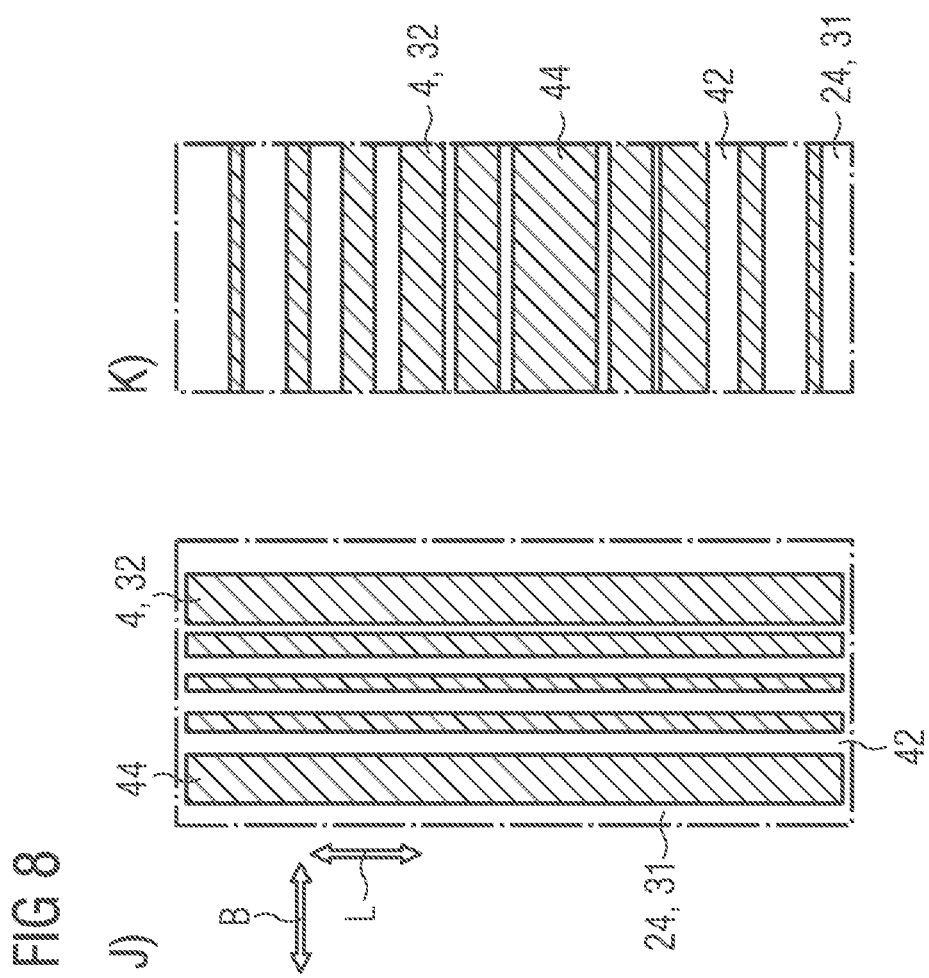

EDGE-EMITTING SEMICONDUCTOR LASER

This patent application is a national phase filing under section 371 of PCT/EP2017/057208, filed Mar. 27, 2017, which claims the priority of German patent application 10 2016 106 949.3, filed Apr. 14, 2016, each of which is incorporated herein by reference in its entirety.

TECHNICAL FIELD

An edge-emitting semiconductor laser is specified.

SUMMARY OF THE INVENTION

Embodiments provide an edge-emitting semiconductor laser which has reduced material stress and a high efficiency.

According to at least one embodiment, the semiconductor laser comprises a semiconductor layer sequence. The semiconductor layer sequence comprises one or more active zones for generating radiation. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or as $Al_nGa_mIn_{1-n-m}As_kP_{1-k}$, wherein in each case $0 \le n \le 1$, $0 \le m \le 1$ and $n+m \le 1$ and $0 \le k < 1$. Preferably, the following applies to at least one layer or to all layers of the semiconductor layer sequence: $0 < n \le 0.8$, $0.4 \le m < 1$ and $n+m \le 0.95$ as well as $0 < k \le 0.5$. Further, the semiconductor layer sequence can have dopants and additional constituents.

According to at least one embodiment, the semiconductor laser is an edge-emitting laser. This means that an emission direction and/or a direction of a beam guidance within the semiconductor laser is perpendicular or is oriented substantially perpendicular to a growth direction of the semiconductor layer sequence.

According to at least one embodiment, the semiconductor laser comprises an electrical contact web. The contact web is preferably located on a top side of the semiconductor layer sequence. The electrical contact web is designed to impress current into the semiconductor layer sequence. The contact web is preferably ohmic-conducting. The top side is in particular a side facing away from a carrier substrate and/or a growth substrate of the semiconductor layer sequence.

According to at least one embodiment, the contact web is applied to the top side only in an electrical contact region or is in electrical contact with the top side only in the contact region. The contact region is, for example, a rectangular region, in plan view onto the top side, in which the semiconductor layer sequence is electrically contacted. Viewed in plan view, the contact region can be congruent or approximately congruent with a waveguide region of the semiconductor laser. The contact web can extend over the entire width and/or length of the waveguide region. Alternatively, the contact web extends only partially along the width and/or length of the waveguide region or of a ridge waveguide, for example, to at most 90% or 80% along each direction.

According to at least one embodiment, the active zone is supplied with current only in the contact region or approximately only in the contact region and thus only in places. In particular, the contact web and/or the contact region form(s) a strip, and only in this strip, viewed in a plan view, a generation of laser radiation takes place in the active zone, including a possibly present, in particular small region of a current spreading occurring in the semiconductor layer sequence.

According to at least one embodiment, the contact web comprises two or more than two metal layers. "Metal layer" means that the corresponding layer consists of a metal or a metal alloy. Alternatively, the term "metal layer" also includes ohmic-conducting layers which are formed from non-metallic, electrically conductive materials. In this case, the term "metal layer" includes ohmic-conducting layers made of transparent conductive oxides or TCOs for short. An example of a material from this material class is indium tin oxide, ITO for short. Particularly preferably, however, the contact web comprises one or more metal layers which consist of a metal or a metal alloy, so that one or more TCO layers can only additionally be present.

According to at least one embodiment, the metal layers of the contact web are arranged at least partially stacked one above the other, in the direction away from the top side. In particular, the metal layers are applied in succession one on top of the other in the contact region. The stack-shaped arrangement can thus result from a production process for the contact web.

According to at least one embodiment, one or more of the metal layers of the contact web are provided with a structuring. Structuring means, in particular, that the respective metal layer only partially covers the contact region, seen in plan view. In particular, the structuring is realized by at least one opening and/or by at least one interruption being formed in the respective metal layer. The term "opening" relates in particular to hole-shaped structures such that a material of the relevant layer surrounds the opening all around. In contrast, an interruption is not surrounded all around by a material of the associated metal layer. In particular, the interruption interrupts the metal layer so that there is no continuous connection within a material of the metal layer over the interruption.

According to at least one embodiment, the structuring of the at least one metal layer causes stresses in the semiconductor layer sequence and/or in the contact web on account of different thermal expansion coefficients of the materials involved, in particular of materials of the semiconductor layer sequence and/or of the contact web. Such stresses result, for example, in bending of the semiconductor laser in the event of temperature changes. In particular, the different metal layers, without the structuring, can act as a type of bimetal which bends in the event of temperature changes. In comparison to an identical semiconductor laser without such a structuring of at least one of the metal layers, bending in the event of temperature changes is reduced due to the structuring.

In at least one embodiment, the edge-emitting semiconductor laser comprises a semiconductor layer sequence having at least one active zone for generating radiation. Electrical contact webs are located on a top side of the semiconductor layer sequence. The contact web is only applied to the top side in an electrical contact region or is in electrical contact with the top side only in the contact region. During operation, the active zone is supplied with current only in places. The contact web comprises a plurality of metal layers which are arranged at least partially stacked one above the other. At least one of the metal layers is provided with a structuring so that said at least one metal layer only partially covers the contact region and has at least one opening and/or interruption. This structuring reduces stresses in the semiconductor layer sequence and/or in the contact web on account of different thermal expansion coefficients of the metal layers and/or of the semiconductor layer sequence.

For electrically contacting edge-emitting semiconductor laser diodes, for example, with a so-called ridge waveguide or even gain-guided lasers, a stack of different electrically conductive layers, in particular metal layers, is usually applied. Typically, these layers are subject to tensions both internally and against one another, which occur in particular in the event of temperature changes. Normally, there is also a mismatch and thus a stress relative to the contacted semiconductor layer sequence. These stresses can lead to a deterioration of the component performance during operation and/or during a heat treatment of the semiconductor laser. In extreme cases, cracks can occur in the relevant layers or a delamination can occur.

In order to reduce such stresses, a temperature-stabilized contact web can be formed or layers and materials can be selected which lead to the smallest stresses. In general, however, this also leads to a lower efficiency of the semiconductor laser. Stresses can also be reduced by corresponding temperature treatments, although this can likewise lead to a reduced power of the semiconductor laser.

In contrast, in the semiconductor laser described here, one or more layers of the contact web are applied in a structured manner. These layers are less stressed internally with respect to one another. This leads in particular to an increased temperature stability of the power parameters of the semiconductor laser, in particular to a lower forward voltage. In addition to the temperature dependence, the forward voltage can optionally already increase solely by the presence of a highly stressed layer, which can be avoided or reduced by the contact web described here.

According to at least one embodiment, the semiconductor layer sequence comprises a ridge waveguide. During operation of the semiconductor laser, the ridge waveguide enables through its geometry a waveguidance and/or a current limitation with regard to a laser radiation to be generated in the region of the active zone. The ridge waveguide is formed in particular by removing material from the semiconductor layer sequence. In this case, the active zone itself is preferably not affected by this material removal.

According to at least one embodiment, the semiconductor layer sequence is based on the material system AlInGaN. A wavelength of the laser radiation generated during operation is thus preferably in the ultraviolet or blue spectral range, for example, at at least 300 nm or 360 nm or 380 nm and/or at at most 550 nm or 540 nm or 500 nm or 480 nm or 440 nm. In particular, the emission wavelength is approximately 405 nm.

According to at least one embodiment, at least one of the metal layers or a plurality of the metal layers of the contact web completely covers the contact region. In particular, the ridge waveguide is completely covered by the metal layer in question. Alternatively, edges of the contact region and/or of the ridge waveguide are free of the respective metal layer. The term "edge" relates, for example, to a region having a width of at most 15% or 10% or 5% or 2% of a total width and/or a total length of the contact region and/or of the ridge waveguide.

According to at least one embodiment, the metal layer provided with the structuring extends along at least 60% or 70% or 80% or 90% of a longitudinal extent and/or a transverse extent of the contact region and/or of the ridge waveguide. In other words, the metal layer provided with the structuring can extend substantially over the entire contact region, both longitudinally and transversely.

According to at least one embodiment, a material of the metal layer provided with the structuring covers the contact region to at least 30% or 40% or 50% or 60% and/or to at most 95% or 90% or 80%. In other words, the contact region can for the most part be covered by the structured metal layer.

According to at least one embodiment, the metal layer provided with the structuring serves for lateral current limitation. This can mean that current is impressed into the semiconductor layer sequence only through a material of this metal layer. In other words, a cross section of a current impression is limited by the structured metal layer itself.

According to at least one embodiment, current is impressed into the semiconductor layer sequence through the at least one opening and/or through the at least one interruption. In this case it is possible that over an entire area of the contact area and/or of the contact web a current flow takes place in the direction perpendicular to the top side through the contact web. Preferably, in this case, a current flow also takes place through the structured metal layer, in the direction perpendicular to the top side.

According to at least one embodiment, the metal layer provided with the structuring is in direct contact with the semiconductor layer sequence. The corresponding metal layer then touches the semiconductor layer sequence, in particular touches a highly doped contact layer of the semiconductor layer sequence.

According to at least one embodiment, the contact web comprises a metal layer which is provided with a structuring and which is spaced apart from the semiconductor layer sequence. The respective metal layer does not touch the semiconductor layer sequence. If a plurality of structured metal layers are present, one of these structured metal layers can touch the semiconductor layer sequence and a further metal layer can be spaced apart from the semiconductor layer sequence and/or from the other structured metal layer.

According to at least one embodiment, the structuring has main directions running transversely to one another. For example, the structuring comprises longitudinal strips and transverse strips, relative to a main direction of extent of the contact web. The structures running transversely to one another can be present in a single metal layer or can also be divided into two or more than two metal layers of the contact web. The corresponding metal layers, which have the structures running transversely to one another, can directly succeed one another and touch each other or can also be accommodated in the contact web at a distance from one another.

According to at least one embodiment, the contact web comprises two or more structured metal layers. The structured metal layers can directly follow one another or can be spaced apart from one another in the direction away from the top side. Said metal layers can have the same type and the same basic pattern with regard to their structuring. A degree of coverage of the contact region by these metal layers can in each case be the same or can change. For example, the degree of coverage of the contact region by the respective metal layers increases or decreases in the direction away from the top side.

According to at least one embodiment, the metal layer provided with the structuring is that layer of the contact web which has the smallest coefficient of thermal expansion. For example, this metal layer is formed from platinum, palladium and/or titanium.

According to at least one embodiment, the metal layer provided with the structuring has a relatively small thickness, relative to a total thickness of the contact web. Thus, the thickness of the structured metal layer is preferably at most 40% or 15% or 5% of the total thickness of the contact web. Alternatively or additionally, this thickness is at least 2% or 5% or 20% of the total thickness.

According to at least one embodiment, the structured metal layer, in particular all structured metal layers, have a thickness of at least 25 nm or 40 nm or 100 nm. Alternatively or additionally, this thickness is at most 1200 nm or 1000 nm or 800 nm or 400 nm or 200 nm or 150 nm. This thickness information can apply to each individual structured metal layer and/or to the totality of the structured metal layers.

According to at least one embodiment, the structured metal layer is at least partially divided into metal strips. The metal strips preferably extend longitudinally or transversely to the contact region. All metal strips of the corresponding metal layer are preferably formed from the same material and are each spaced apart from one another. Furthermore, all metal strips are preferably located in the same plane parallel to the top side of the semiconductor layer sequence.

According to at least one embodiment, one or more of the following relationships applies/apply to a number N of the metal strips and to a width B of the contact region: $0.1 \leq N/B$ or $0.2 \leq N/B$ or $0.4 \leq N/B$; $N/B \leq 1$ or $N/B \leq 1.5$ or $N/B \leq 2$; $0.1$ $\mu m \leq B$ or $0.8$ $\mu m \leq B$ or $1.5$ $\mu m \leq B$; $B \leq 5$ $\mu m$ or $B \leq 3$ $\mu m$ or $B \leq 1.5$ $\mu m$. The width B is dimensionless in the term N/B, and the numerical value corresponds to the value in $\mu m$.

According to at least one embodiment, the metal layer provided with the structuring is subdivided into structural elements. Viewed in a plan view, the structural elements have in particular an H-shaped, a T-shaped, a V-shaped, a round, a rectangular or a cross-shaped design. The structural elements are arranged in particular in a regular pattern, for example, in a hexagonal, a triangular or a rectangular pattern. For a quotient of a number and a mean diameter of the structural elements, preferably the same applies to the metal strips as explained above with respect to the quotient N/B.

According to at least one embodiment, the structural elements have a mean diameter which is at least 0.1 μm or 1 μm or 2 μm and/or at most 50 μm or 30 μm or to μm or 5 μm. Alternatively or additionally, a distance between adjacent metal strips and/or structural elements is at least 0.1 μm or 1 μm or 3 μm and/or at most 25 μm or to μm or 5 μm.

According to at least one embodiment, the electrical contact layer of the semiconductor layer sequence, which forms the top side, is likewise provided with the structuring. This structuring of the contact layer can be designed in exactly the same way as the structuring of the associated metal layer or can also be designed as a negative to this metal layer. The contact layer is preferably a highly doped layer, in particular the highest doped layer of the semiconductor layer sequence.

According to at least one embodiment, the contact web comprises exactly two, three, four, five, six or seven of the metal layers. In other words, a comparatively small number of metal layers is present.

According to at least one embodiment, the metal layer of the contact web which is most remote from the semiconductor layer sequence is a continuous, unstructured and/or uninterrupted layer. Said metal layer preferably completely covers the contact region. A surface of said metal layer facing away from the top side is preferably flat.

According to at least one embodiment, the openings and/or interruptions of the metal layer provided with the structuring are completely or partially filled by a metal or by a semiconductor material. Alternatively, the openings and/or interruptions can also be filled by a dielectric, electrically insulating material.

According to at least one embodiment, a side facing away from the semiconductor layer sequence of a metal layer that directly follows the metal layer provided with the structuring is formed flat. In other words, a planarization can be achieved by means of said metal layer lying directly on the structured metal layer.

According to at least one embodiment, the openings and/or interruptions are completely filled by a filling material. The filling material is preferably not ohmic-conducting. In particular, the filling material is a semiconductor material, a nitride such as $Si_3N_4$ or $Al_3N_4$, an oxide such as silicon dioxide, aluminum oxide, tantalum oxide, zinc oxide, zirconium oxide, hafnium oxide, a silicon oxynitride such as SiON, AlON or diamond-like carbon, DLC for short.

According to at least one embodiment, the semiconductor layer sequence comprises as a crystal lattice-forming material one or more of the following materials: GaN, InGaN, AlGaN, InAlGaN, GaAs, GaP, Si, SiC, Ge. In addition to the semiconductor layer sequence, a carrier for the semiconductor layer sequence, for example, a growth substrate, can be formed from one of these materials, too.

According to at least one embodiment, at least one of the metal layers or all of the metal layers are each composed of one or more materials as listed in the following: platinum, palladium, rhodium, nickel, gold, titanium, aluminum, silver, conducting oxides such as ITO or ZnO, semiconductor material. An electrically conductive layer, in particular an ohmic-conductive layer, is thus present.

Document M. A. Moram et al, Reports on Progress in Physics, year 2009, article "X-ray diffraction of III-nitrides", issue 72, pages 036502 ff., is related to the measurement of stresses by means of the curvature of materials, see in particular section 3.7.2. The disclosure content of this document, in particular of section 3.7.2, is incorporated by reference.

BRIEF DESCRIPTION OF THE DRAWINGS

An edge-emitting semiconductor laser described here is explained in more detail below with reference to the drawing on the basis of exemplary embodiments. Identical reference signs indicate the same elements in the individual figures. However, no relationships to scale are illustrated; rather, individual elements can be represented with an exaggerated size in order to afford a better understanding.

In the Figures:

FIGS. 1 to 7 show schematic sectional representations of exemplary embodiments of edge-emitting semiconductor lasers; and FIGS. 8A to 8K show schematic plan views of structured metal layers for exemplary embodiments of edge-emitting semiconductor lasers.

DETAILED DESCRIPTION OF ILLUSTRATIVE EMBODIMENTS

Figure 1:
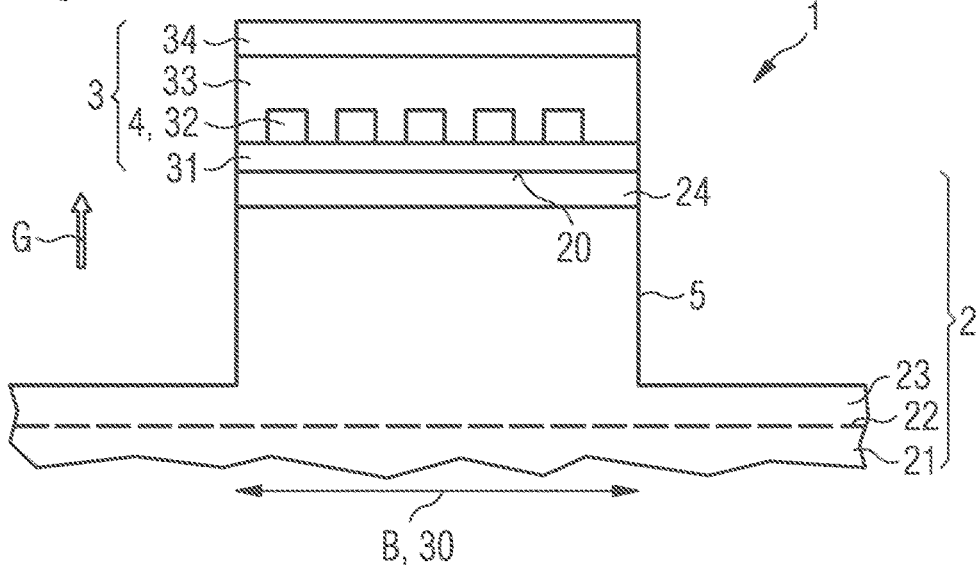

FIG. 1 shows an exemplary embodiment of a semiconductor laser 1. The semiconductor laser 1 is an edge-emitting laser. An emission direction and a mode guidance in the semiconductor laser 1 are thus perpendicular to the drawing plane of FIG. 1.

The semiconductor laser 1 comprises a semiconductor layer sequence 2. Between a first semiconductor region 21 having a first majority charge carrier type and a second semiconductor region 23 having a second majority charge carrier type there is an active zone 22 for generating radiation, in particular for generating light. The semiconductor layer sequence 2 is preferably based on the material system AlInGaN. In this case, the first semiconductor region 21 is preferably n-doped and the second semiconductor region 23 is correspondingly p-doped.

A ridge waveguide 5 is formed in the semiconductor layer sequence 2, also referred to as a strip waveguide or rib waveguide. Optical mode guidance in the semiconductor layer sequence 2 is affected by the ridge waveguide 5.

Furthermore, the semiconductor layer sequence 2 comprises a contact layer 24. The contact layer 24 is preferably highly doped. Furthermore, the contact layer 24 forms a top side 20 of the semiconductor layer sequence 2. An electrical contact region having a width B is formed by the top side 20 on the contact layer 24. The width B is in particular at least 0.2 μm and/or at most 20 μm or 200 μm, depending on whether the semiconductor laser 1 is a monomode laser or a multimode laser. A growth direction G of the semiconductor layer sequence 2 is oriented parallel to the drawing plane and perpendicular to the active zone 22. The top side 20 is preferably opposite a non-drawn carrier of the semiconductor laser 1.

Furthermore, the semiconductor laser 1 has an electrical contact web 3. The contact web 3 is formed from a plurality of layers 31, 32, 33, 34. The layers 31, 32, 33, 34 are ohmic-conducting and preferably each made of a metal or a metal alloy. The layers 31, 32, 33, 34 are at least partially made of materials different from each other and are stacked one on top of the other along the growth direction G.

The first metal layer 31 is located directly on the top side 20 and completely covers the top side 20 in the ridge waveguide 5. The second metal layer 32 is provided with a structuring 4 and only partially covers the first metal layer 31. The third metal layer 33, which completely mantles the structuring 4, is located above the second metal layer 32. A side of the third metal layer 33 facing away from the semiconductor layer sequence 2 is shaped flat. Finally, the fourth metal layer 34 is located over the whole area on the third metal layer 33 and covers the latter. Further layers of the semiconductor laser 1, such as passivation layers or electrical supply lines, are not shown in order to simplify the illustration, as are the mechanical support or heat sinks.

The first metal layer 31 is, for example, a palladium layer having a thickness of 50 nm. The structured second metal layer 32 is, for example, made of titanium with a thickness of 100 nm. The third metal layer 33 has a thickness of 200 nm and is formed from platinum. The fourth metal layer 34 is configured, for example, for contacting by means of soldering and has a relatively large thickness, in particular of more than 50% of a total thickness of the contact web 3. For example, the fourth metal layer 34 is formed from gold having a thickness of 1 μm, as is also possible in all other exemplary embodiments. It is optionally possible to deviate from said thicknesses by up to 50%.

For a ratio of a number of structural elements of the structuring 4, seen in cross section, and a width of the ridge waveguide B, specified dimensionless in μm, it is preferred that this ratio is approximately 0.5. A distance between adjacent elements of the structuring 4 is preferably greater than 0.1 μm and/or less than 5 μm, in particular approximately 0.5 μm. A width of the structural elements of the structuring 4 is preferably at least to nm and/or at most 5 μm, in particular approximately 2 μm.

Figure 2:
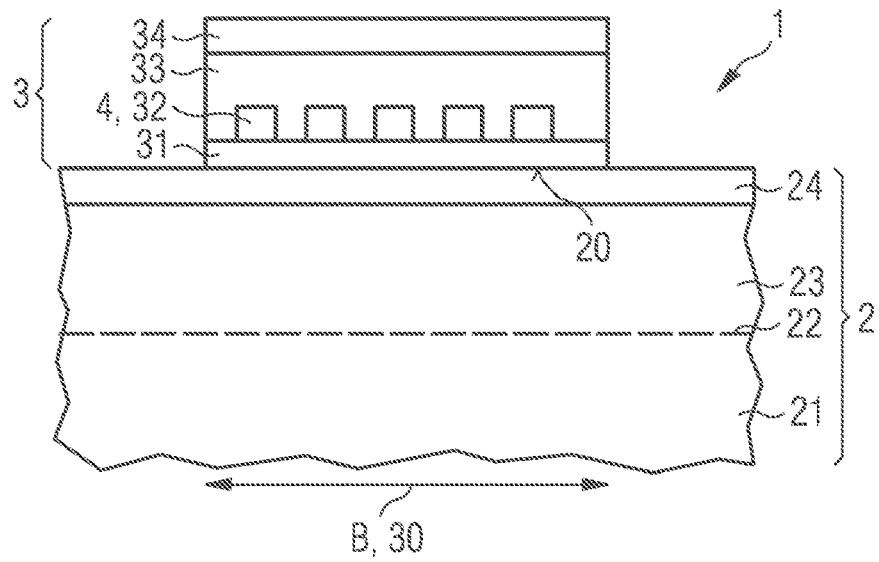

The semiconductor laser 1, as shown in FIG. 2, is a so-called gain-guided laser. In other words, the semiconductor laser 1 of FIG. 2 can be a so-called oxide strip laser. In this case, the semiconductor layer sequence 2 is free of a ridge waveguide and is thus unstructured in the region of a laser activity. The electrical contact region 30 is defined by the contact web 3. Otherwise, the exemplary embodiment of FIG. 2 corresponds to the exemplary embodiment of FIG. 1.

Figure 3:
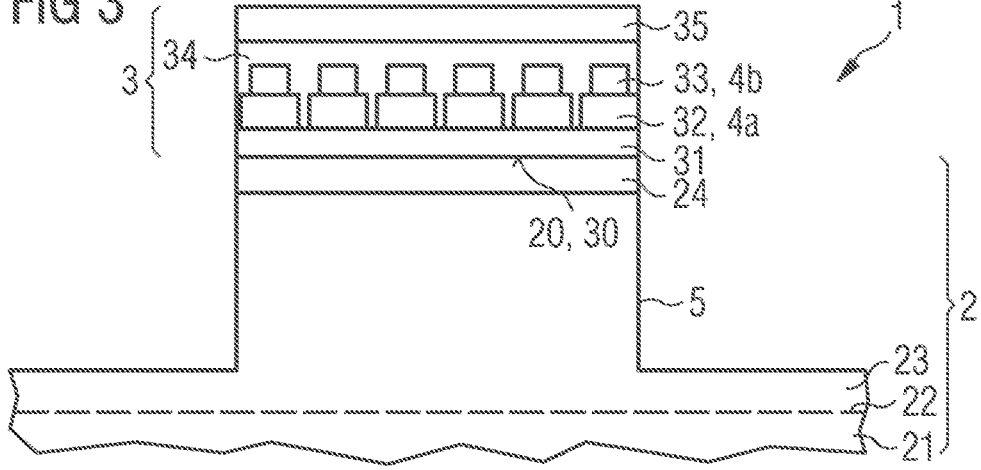

In the exemplary embodiment of FIG. 3, the second and third metal layers 32, 33, which immediately follow one another, are each provided with a similar structuring 4a, 4b. In the direction away from the semiconductor layer sequence 2, a degree of coverage of the contact region 30 by the structurings 4a, 4b decreases. A region between the structurings 4a, 4b is completely filled by the fourth metal layer 34. The topmost, fifth metal layer 35 is in turn flat. Otherwise, the statements made in relation to FIG. 1 apply correspondingly.

Deviating from the representation in FIG. 3, it is also possible that a further, continuous and/or unstructured metal layer is located between the two structured metal layers 32, 33.

Figure 4:
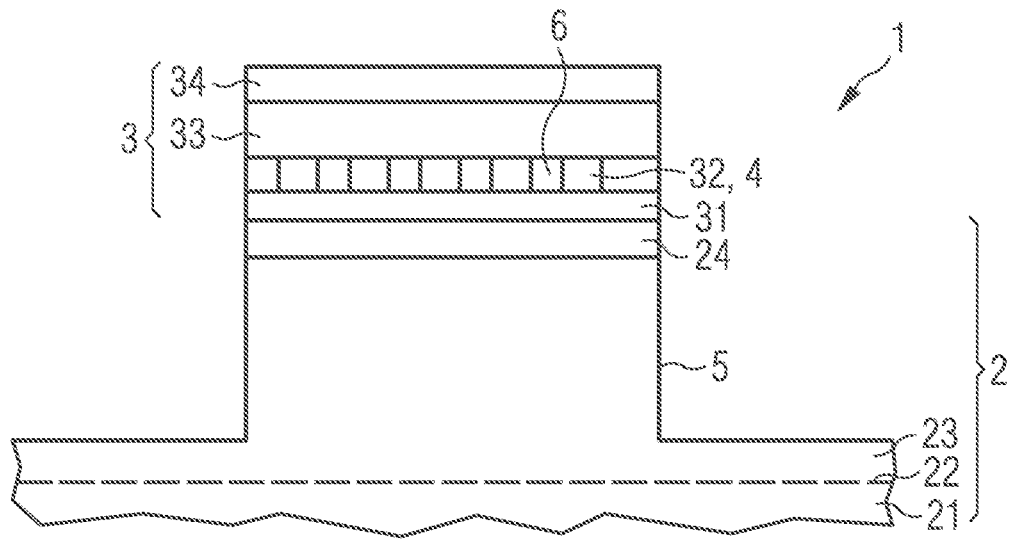

In the exemplary embodiment of FIG. 4, the structured second metal layer 32 is located between two plane-parallel or approximately plane-parallel metal layers 31, 33. The regions laterally alongside the structuring 4 of the second metal layer 32 are partially or completely filled with a filling material 6. The filling material 6 is formed, for example, by another metal or by a dielectric material or also by a semiconductor material. Alternatively, it is possible for the filling material 6 to be completely absent, so that evacuated gaps remain or gas-filled intermediate regions are present.

Figure 5:
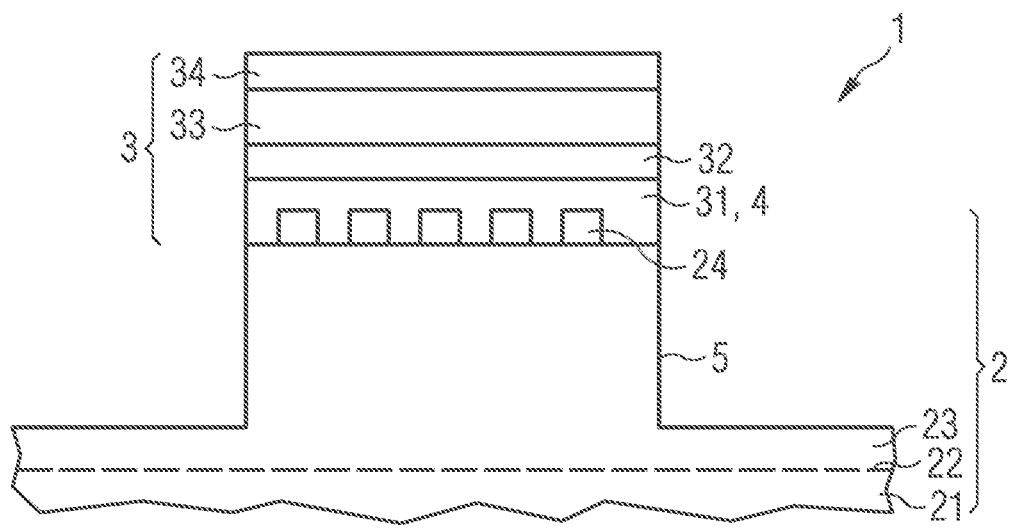

In the exemplary embodiment of FIG. 5, the first metal layer 31 directly on the semiconductor layer sequence 2 is structured. The contact layer 24 is likewise structured. In this case, the first metal layer 31 represents a negative to the geometry of the contact layer 24.

FIG. 6 shows that the structured first metal layer 31 is located directly on the semiconductor layer sequence 2. The second metal layer 32 thereby completely mantles the first metal layer 31 with the structuring 4. Also the structured metal layers as illustrated in the exemplary embodiments of FIG. 1 to 5 or 7 can be attached directly to the semiconductor layer sequence 2 in each case.

As in all other exemplary embodiments, the electrical contact layer 24 of the semiconductor layer sequence 2 is optional. The contact web 3 can thus be attached directly to the second semiconductor region 23.

In the exemplary embodiment of FIG. 7, it is shown that the further metal layers 33, 34 have a shape of the structuring 4 at least partially. The structuring 4 thus also extends partly into the metal layers 33, 34 following the actually structured metal layer 32. The same can also apply to all other exemplary embodiments.

FIG. 8A shows a plan view of the semiconductor laser 1, in particular as illustrated in conjunction with FIG. 1. The contact web 3 is located only on the ridge waveguide 5. In a departure therefrom, the contact web 3 can also be applied to further regions of the semiconductor layer sequence 2, wherein in these further regions an electrical insulation layer is then present between the semiconductor layer sequence 2 and the contact web 3. A longitudinal extent L of the contact web 3 is preferably equal to or approximately equal to a longitudinal extent of the semiconductor layer sequence 2 along a resonator axis. The longitudinal extent L is, for example, at least 50 μm or 200 μm and/or at most 2 mm or 0.5 mm or 1.5 mm. The contact web 3 can also be narrower and/or shorter than the ridge waveguide 5.

FIGS. 8B to 8I schematically illustrate different structurings 4 of the exemplary second metal layer 32. The illustrated structurings 4 can also be used for all other metal layers 31, 33, 34, 35 and can be used accordingly in the exemplary embodiments of FIGS. 1 to 7.

According to FIG. 8B, the structuring 4 is formed by parallel metal strips 44 which are separated from one another by continuous interruptions 42. The metal strips 44 are applied with a uniform density, as can also apply to all other structurings 4. The metal strips 44 extend perpendicular to the longitudinal extent L and parallel to the width B.

According to FIG. 8C, rectangular structural elements 43 are present which extend along the longitudinal extent L in a manner similar to divided longitudinal strips. Adjacent structural elements 43 are separated from one another by the interruptions 42. Along the longitudinal extent L and the width B, the same widths of the interruptions 42 are preferably present, in contrast to the illustration. Alternatively, for example, the interruptions 42 can be designed to be larger along the width B than shown in FIG. 8C.

According to FIG. 8D, the structural elements 43 are H-shaped when viewed in a plan view. In this case, the structural elements 43 are preferably arranged interlocking with one another.

According to FIG. 8E, the structural elements 43 are circular in plan view. Deviating therefrom, hexagonal or triangular structural elements 43 can also be provided, which are arranged approximately in a hexagonal pattern.

FIG. 8F shows that the structuring 4 is formed by metal strips 44 which extend substantially completely along the longitudinal extent L. Preferably, two structured metal layers are present in the contact web 3, which are spaced apart from one another and of which one is designed according to FIG. 8B and a further is designed according to FIG. 8F.

According to FIG. 8G, the structuring 4 is realized by a combination of the structural elements from FIGS. 8B and 8F in a single metal layer 32. By means of this pattern, openings 41 are formed which are surrounded all around by a material of the layer, seen in plan view.

FIG. 8H shows that the structural elements 43 are designed as crosses. Deviating from the representation in FIG. 8H, the cross-shaped structural elements 43 can also be arranged in an interlocking manner.

In FIG. 8I, the structural elements 43 are diamond-shaped or parallelogram-shaped when viewed in plan view. As a result, a relatively high degree of coverage can be achieved with the structural elements 43.

According to FIGS. 8J and 8K, the widths of the metal strips 44 are varied, either along the width B, see FIG. 8J, or along the longitudinal extent L, see FIG. 8K. In this case, a maximum degree of coverage with the metal strips 44 or also with the structural elements 43 can be present in the middle, see FIG. 8K, or at the edges, see FIG. 8J. Corresponding density gradients can also occur in the exemplary embodiments of FIGS. 8C to 8E and 8G to 8I. In contrast to the drawings, the metal strips 44 or the structural elements 43 of FIGS. 8B, 8C, 8D, 8F, 8G and 8K preferably do not extend as far as the outer edges of the contact region 3, seen in plan view.

A strong temperature gradient generally prevails in a laser diode. The temperature is normally highest at output facets. In contrast, the temperature is lower perpendicular to the emission direction in the center of the contact web 3. Therefore, on the facets and/or in the center of the contact web 3, in particular of the ridge waveguide 5, narrower metal strips 44 and/or a lower density of the structure elements 43 are preferred. The density gradients of FIGS. 8J and 8K can also be combined with one another.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. An edge-emitting semiconductor laser comprising:
a semiconductor layer sequence having an active zone for generating radiation; and
an electrical contact web arranged on a top side of the semiconductor layer sequence,
wherein the contact web is located on the top side only in an electrical contact region or is in electrical contact with the top side only in the contact region so that the active zone is supplied with current only in places during operation,
wherein the contact web comprises a plurality of metal layers at least partially stacked one above the other,
wherein at least one of the metal layers comprises a structuring so that the at least one metal layer only partially covers the contact region and has at least one opening or interruption,
wherein the structuring reduces stresses of the semiconductor layer sequence on account of different thermal expansion coefficients of the metal layers, and
wherein a metal layer of the contact web which is furthest away from the semiconductor layer sequence is a continuous, unstructured layer completely covering the contact region.

2. The semiconductor laser according to claim 1,
wherein the semiconductor layer sequence comprises a ridge waveguide configured to guide a wave of a laser radiation generated in a region of the active zone during operation,
wherein the semiconductor layer sequence is based on AlInGaN,
wherein the at least one metal layer comprising the structuring extends along at least 70% of a longitudinal extent and a transverse extent of the contact region, and
wherein the at least one metal layer comprising the structuring covers the contact region to at least 40% and to at most 95%.

3. The semiconductor laser according to claim 1, wherein the at least one metal layer comprising the structuring is configured for lateral current restriction so that current is impressed only through this metal layer into the semiconductor layer sequence.

4. The semiconductor laser according to claim 1, wherein current is impressed into the semiconductor layer sequence through the at least one opening or interruption by the at least one metal layer comprising the structuring and being closest to the semiconductor layer sequence.

5. The semiconductor laser according to claim 1, wherein the at least one metal layer comprising the structuring is in direct contact with the semiconductor layer sequence.

6. The semiconductor laser according to claim 5,
wherein two of the metal layers comprise structurings, and
wherein the structurings of the two metal layers have main directions running transversely with respect to one another.

7. The semiconductor laser according to claim 1, wherein the at least one metal layer comprising the structuring is spaced apart from the semiconductor layer sequence.

8. The semiconductor laser according to claim 7,
wherein two of the metal layers comprise structurings, and
wherein the structurings of the two metal layers have main directions running transversely with respect to one another.

9. The semiconductor laser according to claim 1,
wherein at least two of the metal layers comprise structurings,
wherein the metal layers follow one another directly in a direction away from the top side, and
wherein a degree of coverage of the contact region through the metal layers decreases in the direction away from the top side.

10. The semiconductor laser according to claim 1,
wherein the at least one metal layer comprising the structuring is a metal layer having a smallest coefficient of thermal expansion,
wherein the at least one metal layer comprising the structuring has a thickness of at most 15% of a total thickness of the contact web, and
wherein the thickness of the at least one metal layer is at least 40 nm and at most 400 nm.

11. The semiconductor laser according to claim 1,
wherein the at least one metal layer comprising the structuring is at least partially divided in metal strips which extend along the contact region,
wherein, for a number N of the metal strips and for a width B of the contact region, the following applies: specified in inverse micrometers: $0.2 \leq N/B \leq 1.5$, and $0.1\ \mu m \leq B \leq 5\ \mu m$, and
wherein a distance between adjacent metal strips is between 0.1 μm and 5 μm inclusive.

12. The semiconductor laser according to claim 1, wherein the at least one metal layer comprising the structuring is at least partially divided into round, rectangular, H-shaped, T-shaped, V-shaped or cross-shaped structural elements and forms a hexagonal, triangular or rectangular arrangement pattern.

13. The semiconductor laser according to claim 1,
wherein an electrical contact layer of the semiconductor layer sequence which forms the top side is further provided with the structuring, and
wherein the contact web has between 2 and 7 the metal layers inclusive.

14. The semiconductor laser according to claim 1, wherein a first one of the metal layers which is located directly on the top side is a continuous, unstructured layer completely covering the top side in the contact region so that the at least one metal layer comprising the structuring is located between the metal layer located directly at the top side and the metal layer which is furthest away from the semiconductor layer sequence.

15. The semiconductor laser according to claim 1,
wherein the at least one opening or interruption in the at least one metal layer comprising the structuring is completely filled by a metal, a semiconductor material or a dielectric, and
wherein a side facing away from the semiconductor layer sequence of a metal layer directly following the at least one metal layer comprising the structuring or following the one of the metal layers comprising the structuring which is furthest away from the semiconductor layer sequence is of planar fashion.

16. The semiconductor laser according to claim 1, wherein a first one of the metal layers located directly on the top side is a continuous, unstructured layer completely covering the top side in the contact region.

17. An edge-emitting semiconductor laser comprising:
a semiconductor layer sequence having an active zone for generating radiation; and
an electrical contact web arranged on a top side of the semiconductor layer sequence,
wherein the contact web is located on the top side only in an electrical contact region or is in electrical contact with the top side only in the contact region so that the active zone is supplied with current only in places during operation,
wherein the contact web comprises a plurality of metal layers at least partially stacked one above the other,
wherein at least one of the metal layers comprises a structuring so that the at least one metal layer only partially covers the contact region and has at least one opening or interruption,
wherein the structuring reduces stresses of the semiconductor layer sequence on account of different thermal expansion coefficients of the metal layers,
wherein the at least one metal layer comprising the structuring is a metal layer having a smallest coefficient of thermal expansion,
wherein the at least one metal layer comprising the structuring has a thickness of at most 15% of a total thickness of the contact web, and
wherein the thickness of the at least one metal layer is at least 40 nm and at most 400 nm.

18. The semiconductor laser according to claim 17,
wherein the semiconductor layer sequence comprises a ridge waveguide configured to guide a wave of a laser radiation generated in a region of the active zone during operation,
wherein the semiconductor layer sequence is based on AlInGaN,
wherein the at least one metal layer comprising the structuring extends along at least 70% of a longitudinal extent and a transverse extent of the contact region, and
wherein the at least one metal layer comprising the structuring covers the contact region to at least 40% and to at most 95%.

19. An edge-emitting semiconductor laser comprising:
a semiconductor layer sequence having an active zone for generating radiation; and
an electrical contact web arranged on a top side of the semiconductor layer sequence,
wherein the contact web is located on the top side only in an electrical contact region or is in electrical contact with the top side only in the contact region so that the active zone is supplied with current only in places during operation,
wherein the contact web comprises a plurality of metal layers at least partially stacked one above the other,
wherein at least one of the metal layers comprises a structuring so that the at least one metal layer only partially covers the contact region and has at least one opening or interruption,
wherein the structuring reduces stresses of the semiconductor layer sequence on account of different thermal expansion coefficients of the metal layers,
wherein the at least one metal layer comprising the structuring is at least partially divided in metal strips which extend along the contact region, wherein, for a number N of the metal strips and for a width B of the contact region, the following applies: specified in inverse micrometers: 0.2≤N/B≤1.5, and 0.1 µm≤B≤5 µm, and wherein a distance between adjacent metal strips is between 0.1 µm and 5 µm inclusive.

20. The semiconductor laser according to claim 19, wherein the semiconductor layer sequence comprises a ridge waveguide configured to guide a wave of a laser radiation generated in a region of the active zone during operation, wherein the semiconductor layer sequence is based on AlInGaN, wherein the at least one metal layer comprising the structuring extends along at least 70% of a longitudinal extent and a transverse extent of the contact region, and wherein the at least one metal layer comprising the structuring covers the contact region to at least 40% and to at most 95%.

* * * * *